United States Patent
Fortune

[19]

[11] Patent Number: 6,043,458
[45] Date of Patent: Mar. 28, 2000

[54] PNEUMATIC ROTATABLE HAND HELD PICKUP TOOL

[76] Inventor: William S. Fortune, 29866 Cuthbert Rd., Malibu, Calif. 90265

[21] Appl. No.: 09/359,451

[22] Filed: Jul. 22, 1999

Related U.S. Application Data

[62] Division of application No. 08/818,490, Mar. 14, 1997, Pat. No. 5,928,537.

[51] Int. Cl.[7] ..................................................... H05B 1/00
[52] U.S. Cl. .......................... 219/230; 219/228; 294/64.1
[58] Field of Search .................................... 219/230, 228, 219/229, 227, 231; 228/51, 55, 264, 47.1; 294/64.1, 64.2, 64.3; 29/743; 264/3, 21

[56] References Cited

U.S. PATENT DOCUMENTS

| | | | |
|---|---|---|---|
| 2,280,658 | 4/1942 | Miller ...................................... | 294/64.1 |
| 3,466,079 | 9/1969 | Mammel ................................. | 294/64.1 |
| 3,517,958 | 6/1970 | Boucher et al. ........................ | 294/64.1 |
| 3,523,706 | 8/1970 | Logue ..................................... | 294/64.1 |
| 3,912,317 | 10/1975 | Ohnaka ................................... | 294/64.1 |
| 4,828,306 | 5/1989 | Blatt ....................................... | 294/64.2 |
| 4,969,676 | 11/1990 | LaMagna ............................... | 294/64.3 |
| 5,106,139 | 4/1992 | Palmer et al. .......................... | 294/64.1 |
| 5,290,082 | 3/1994 | Palmer et al. .......................... | 294/64.1 |
| 5,314,223 | 5/1994 | Harper, Jr. et al. .................... | 294/64.1 |

*Primary Examiner*—Teresa Walberg
*Assistant Examiner*—Vinod D Patel
*Attorney, Agent, or Firm*—Daniel T. Anderson Attorney

[57] ABSTRACT

A hand held vacuum or venturi effect pickup tool is disclosed having a body and a forwardly extending tubular member, which may be curved, carrying a rotatable pickup head on its forward end. A rotatable nozzle is carried by the forward portion of the body and an elastomeric tube connected to the nozzle and to the pickup head and extending loosely over the tubular member retains the pickup head to the tubular member and provides a rotational, positioning control of the pickup head by rotating the nozzle about its connection to the body of the tool.

1 Claim, 9 Drawing Sheets

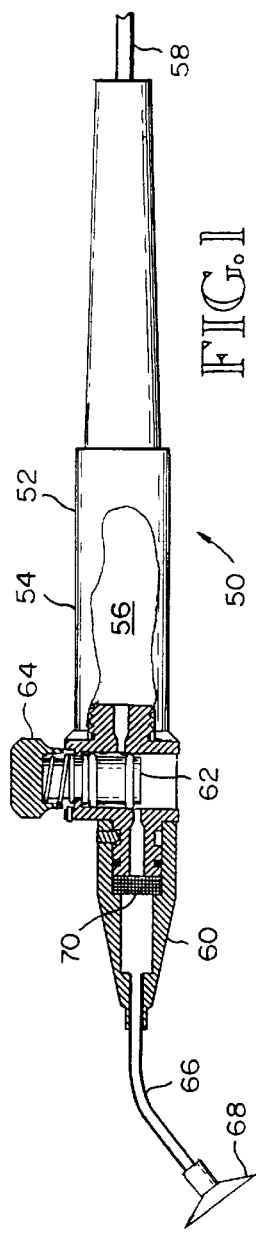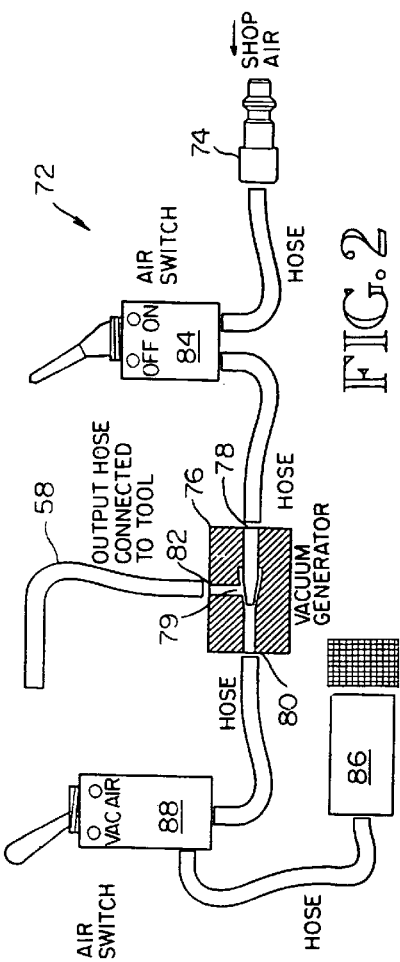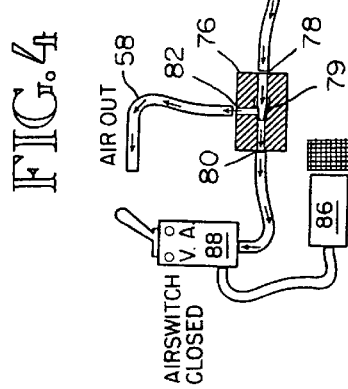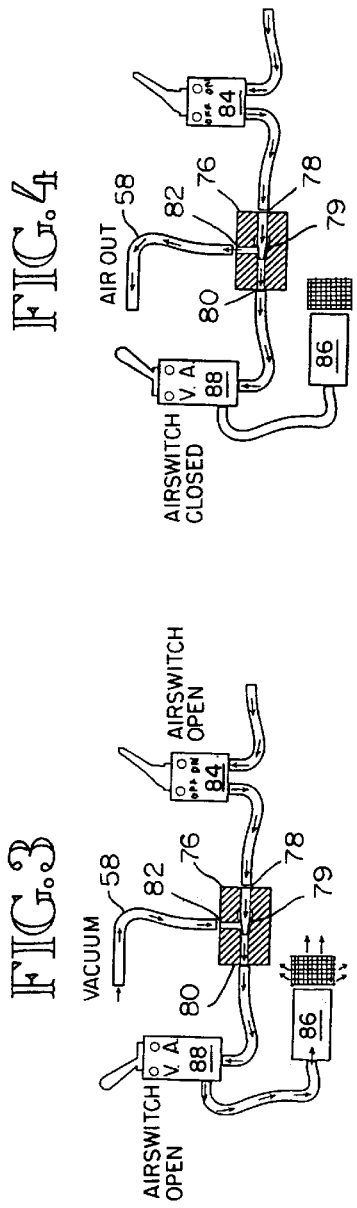

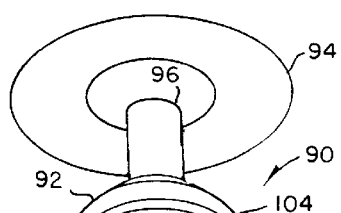
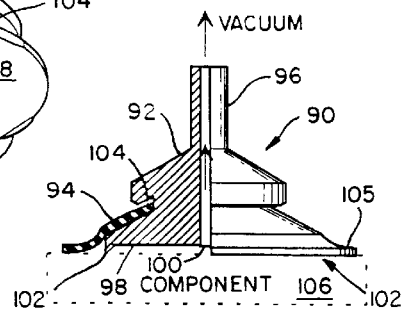
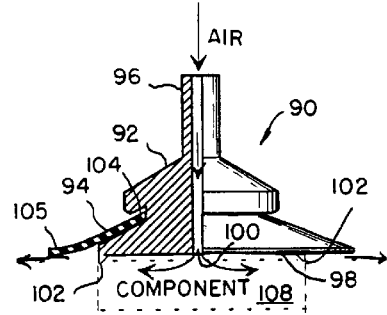
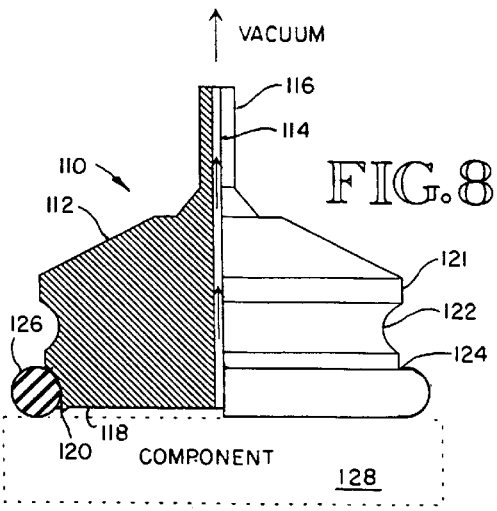
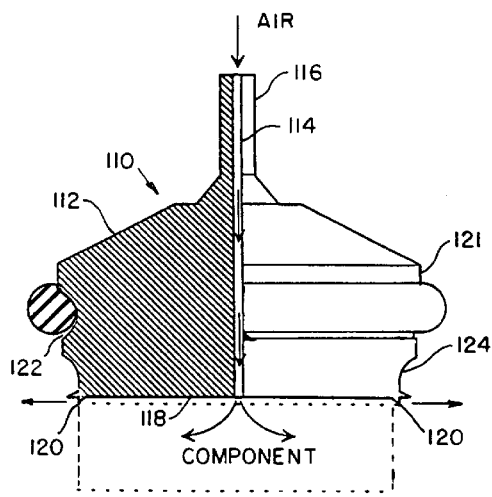
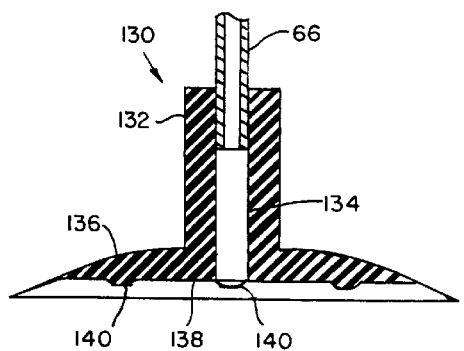
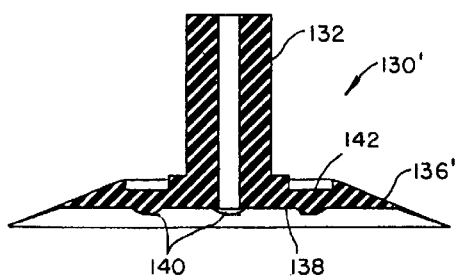

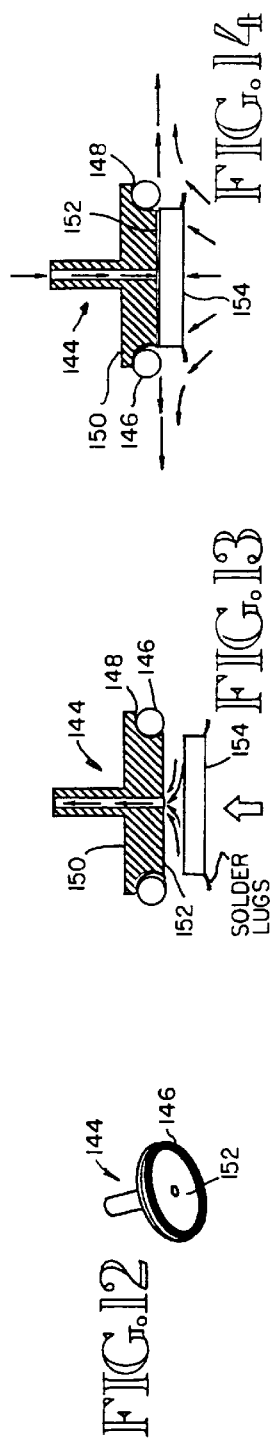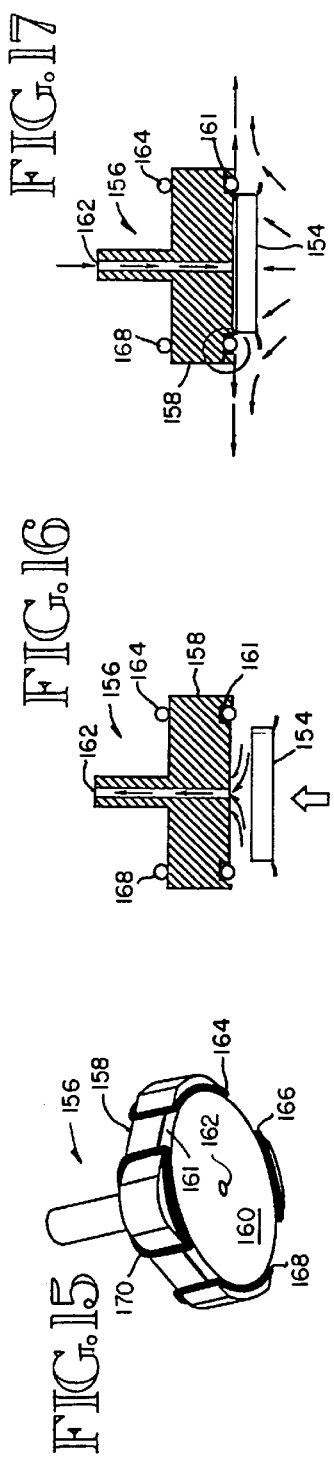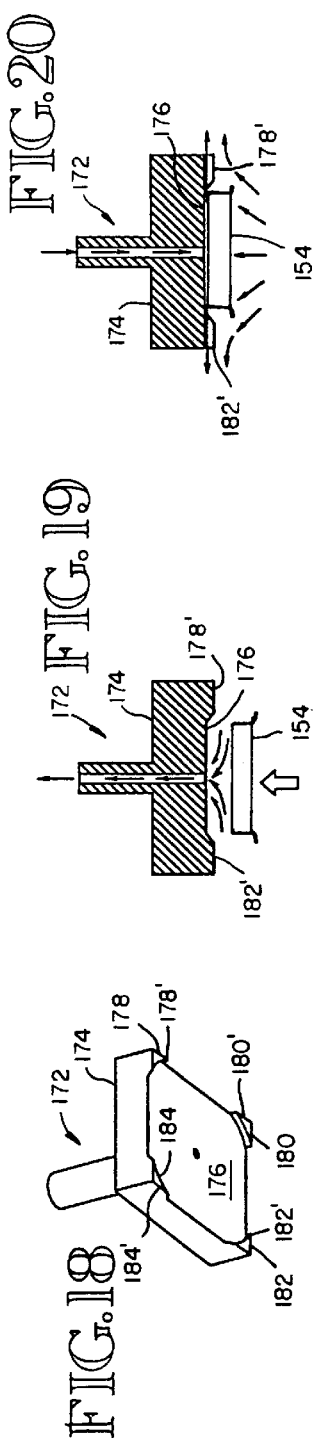

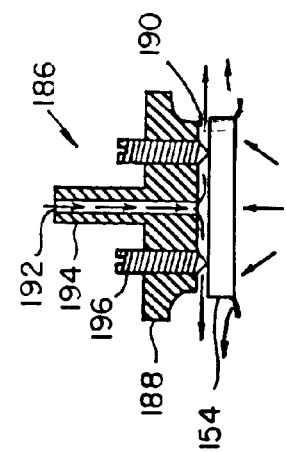
FIG. 21
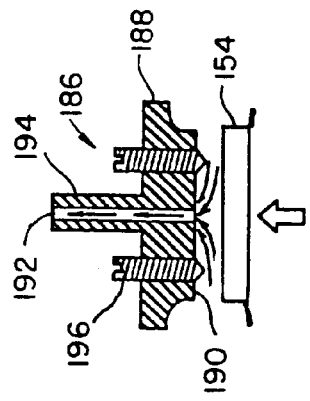
FIG. 22 FIG. 23
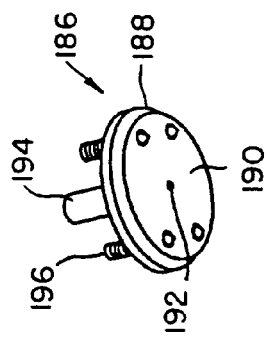
FIG. 24
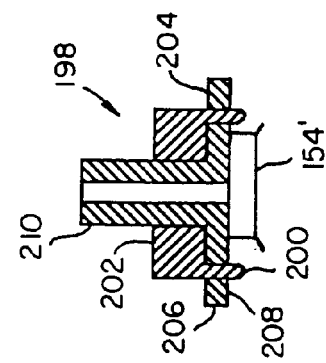
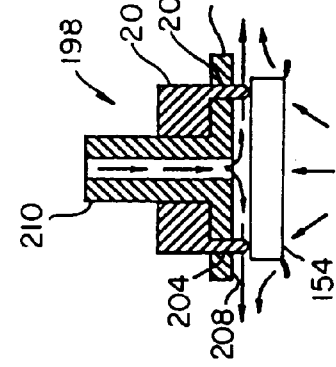
FIG. 25 FIG. 26
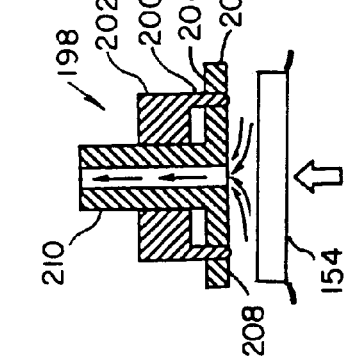
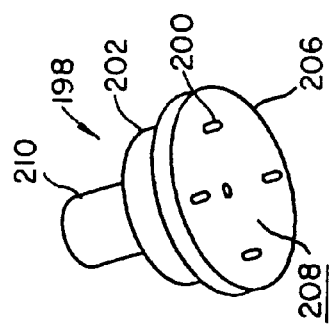
FIG. 27

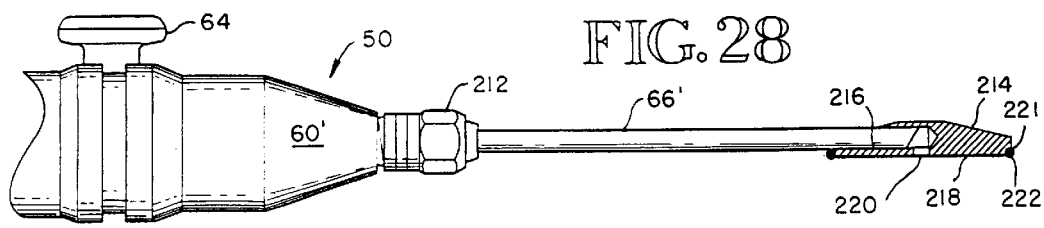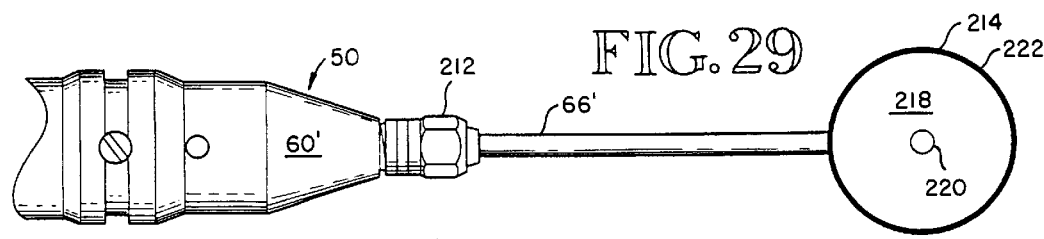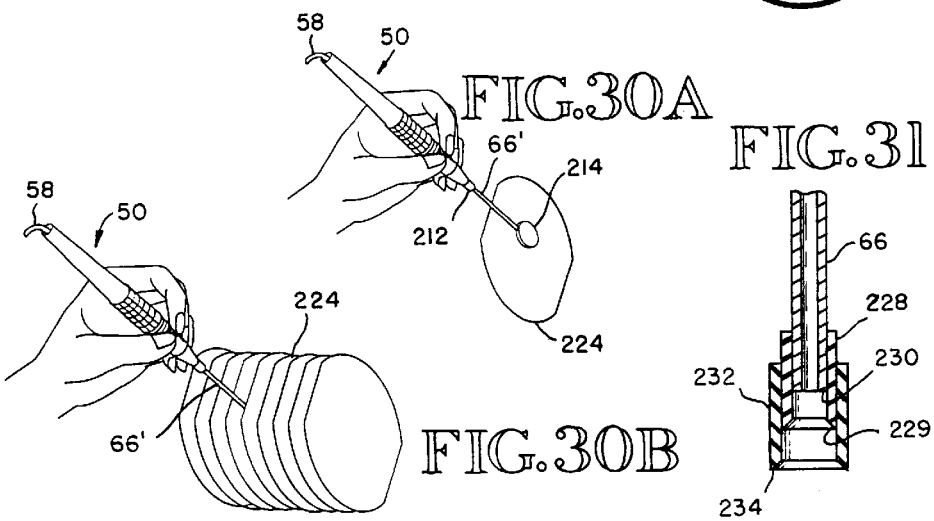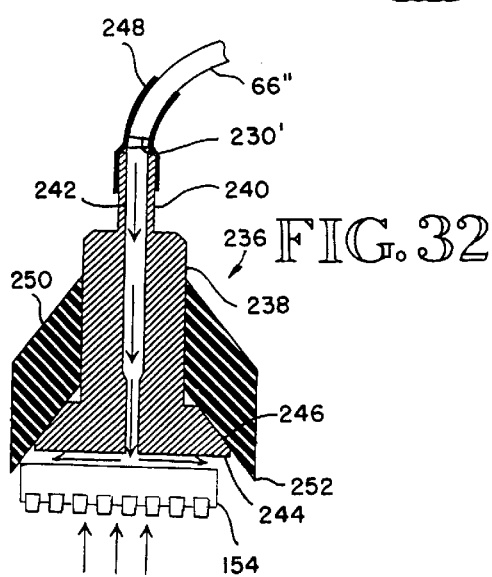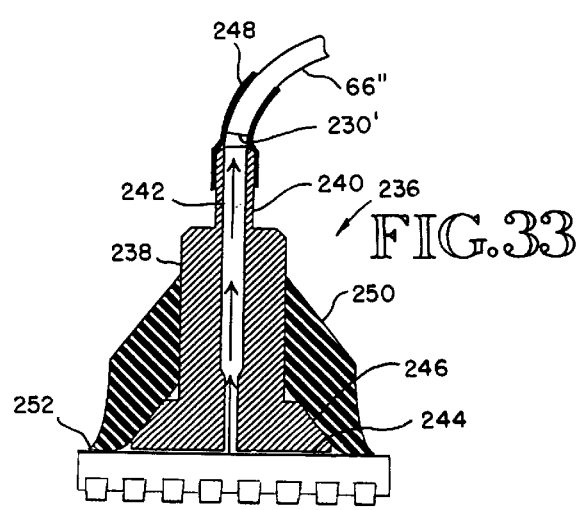

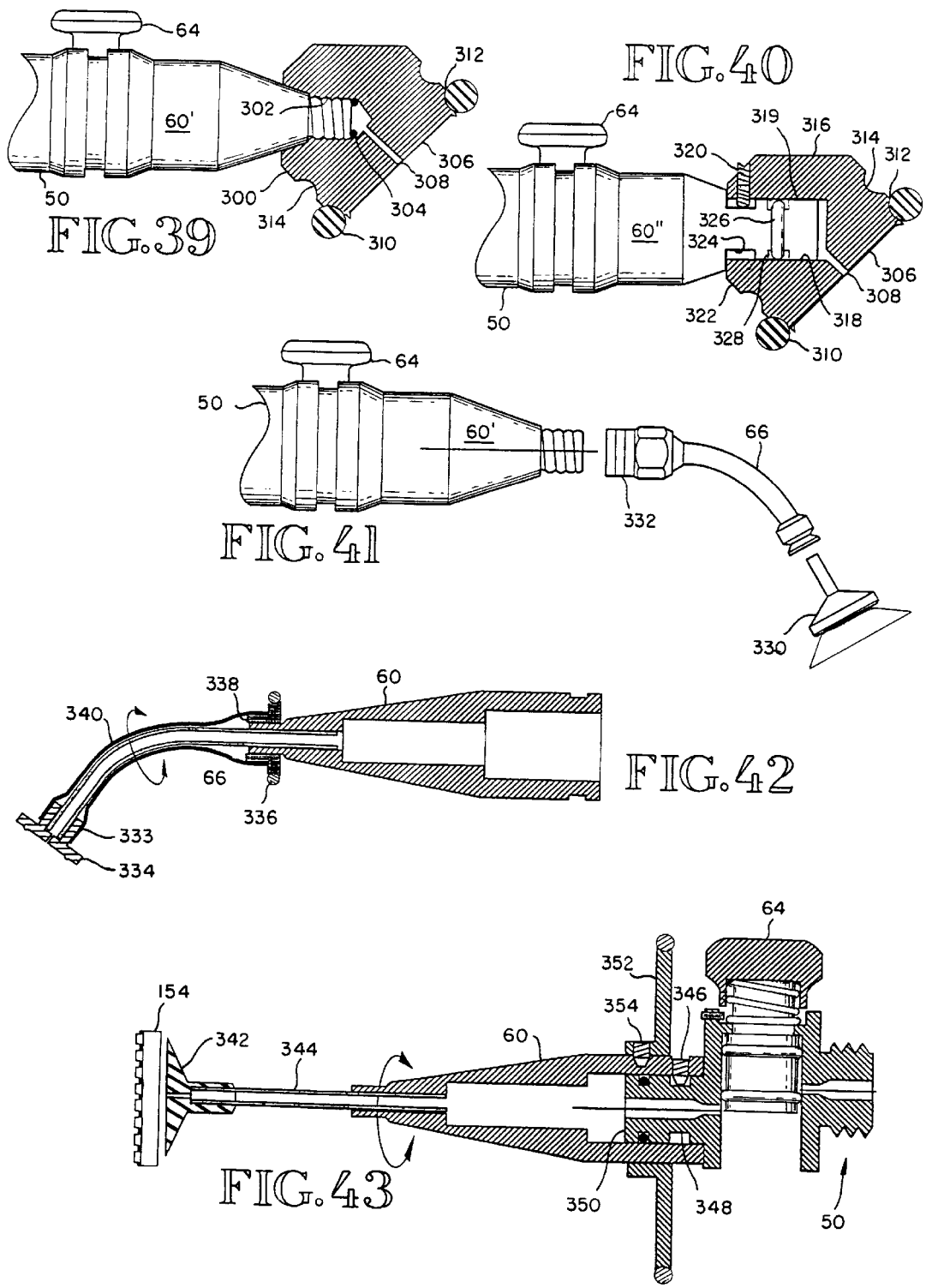

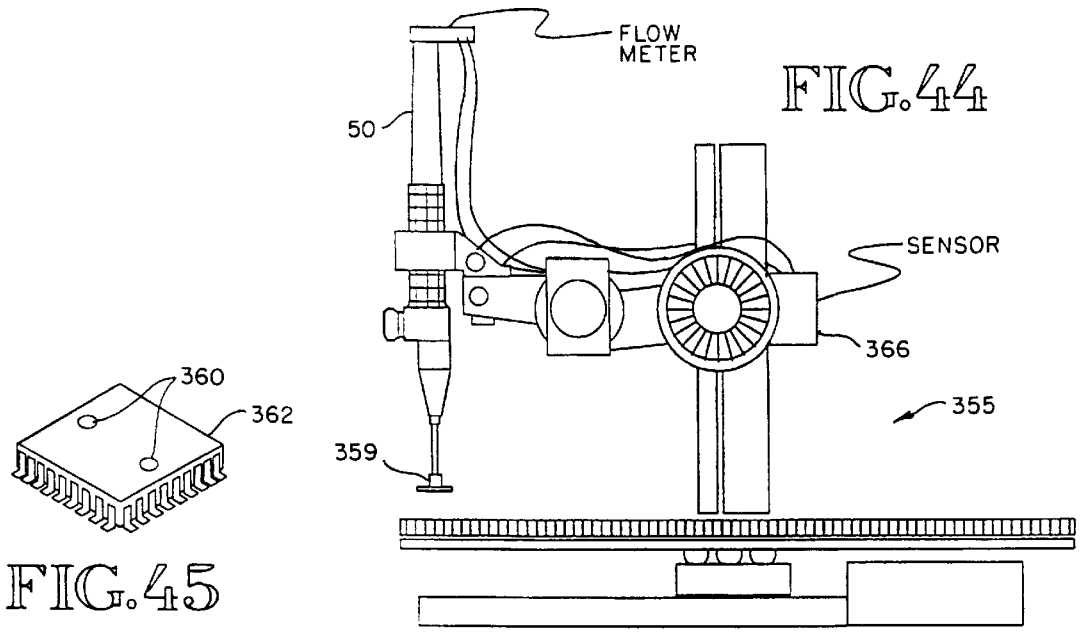
FIG. 44
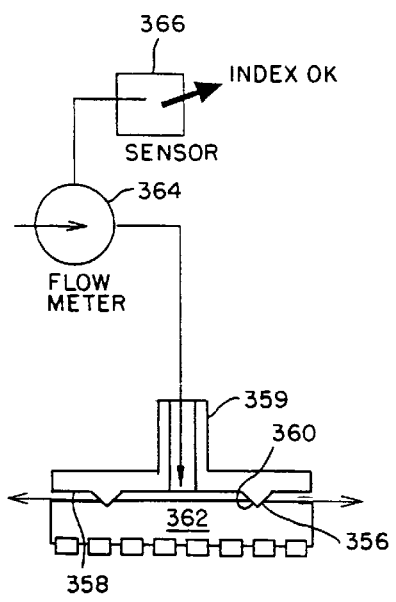
FIG. 45
FIG. 46
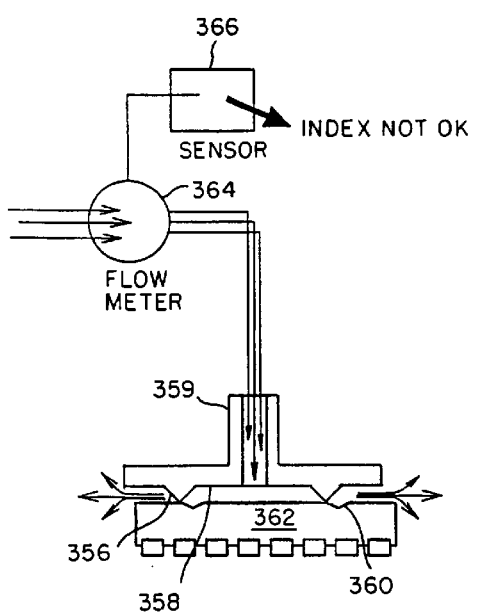
FIG. 47

PNEUMATIC ROTATABLE HAND HELD PICKUP TOOL

This application is a division of Ser. No. 08/818,490, U.S. Pat. No. 5,928,537, filed Mar. 14, 1997.

BACKGROUND OF THE INVENTION

This invention relates generally to a tool system for handling small parts and more particularly to improvements in hand held, pneumatically operated implements for picking up, placing, adjusting, or removing delicate or sensitive parts such as an electronic microelement to be affixed and connected to a circuit board or a larger integrated circuit chip to be affixed and connected with its many solder points to a circuit board. The term "pneumatic" means that forces due to a vacuum or to venturi effects are utilized for holding or lifting the part; and "hand held" is intended to include robotic applications.

In the development of modem microelectronics, the various elements and components incorporated into the assembly of a circuit as, for example, in a microprocessor, a computer, or controls for automated apparatus, have typically become smaller, more delicate and sensitive, more costly, and very critical in their exact placement, as on a circuit board, during assembly or manufacture or testing or repair or replacement. Consequently, it has become increasingly difficult, for example, to successfully and efficiently select a small part, pick it up, place it precisely, hold it during a soldering or other securing process, and then release it—all without placement or orientation error and without subjecting the part to unacceptable mechanical, thermal, or electrical stresses.

Prior art efforts have typically been directed toward mechanical holding techniques such as clamps, forceps, tweezers, or the like; and in some applications such approaches are satisfactory. However, holding a small part by mechanical measures have disadvantages of lack of reliability or of the part slipping away and being dropped. Further the mechanical strees caused by the tweezer compression can, for delicate parts, be intolerable. Further, such tools suffer a lack of versatility in exactly how and in what orientation it selects and picks up the part.

One non-mechanical approach has been to provide a hand held tool containing a spring loaded piston creating a vacuum chamber between the interior of the tool and a suction cup affixed to the nozzle end of the tool. When a part is to be picked up, the piston is pushed forwardly by a plunger or trigger toward the nozzle, the part is placed against the suction cup, and the piston released to create a holding vacuum by the spring. When the part is to be released, the plunger or trigger is again pushed forwardly to extinguish the vacuum within the chamber and the holding suction cup. Another version of this technique is to provide instead of a spring loaded piston within the chamber, a fountain pen type elongated bladder which is compressed by a trigger holding a vane against the side of the bladder to create a vacuum. Again, when the part is to be released, the vane against the bladder is pushed inwardly by the trigger and the holding vacuum is extinguished.

These prior art vacuum devices suffer from at least three limitations which for many modern applications constitute serious disadvantages: first, there is a limit to the magnitude or volume of the vacuum available due to the geometry of the piston chamber or bladder; second, some leakage is inherent and thus the holding time for such a device is limited such that its holding force is not constant, diminishes, and at an unknown moment the part may be released and be dropped; third, the necessity of "working" the piston to extinguish the holding vacuum may cause an unacceptable recoil or other displacement of the part just as it is being critically emplaced.

Another problem unsolved in this art has been to avoid thermal damage to a part while it is being emplaced or removed and its connecting solder points are necessarily being fused or reflowed by application of soldering heat.

It is an object of the present invention to provide a pneumatic handling implement for small parts which is not subject to these disadvantages and limitations of the prior art.

It is another object to provide such a tool which is light in weight and exceedingly easy to handle and operate.

It is another object to provide such a tool which operates from any common source of compressed air to create selectively its own vacuum, or venture air flow for lifting effects.

It is another object to provide such a tool whose various embodiments include holding features covering a wide range of shapes and sizes adapted to optimumly handle any small parts.

It is another object to provide such a tool which may supply coolant air for a part being held while being soldered.

It is another object to provide such a tool which may be readily adapted for utilization in robotic applications.

SUMMARY OF THE INVENTION

Briefly, these and other objects of the invention are achieved in a presently preferred example of the invention in which a tool is provided having a central body portion enclosing an air chamber and having a forwardly extending rigid tube member, which may be curved, which supports a rotatable pneumatic pickup head at its forward end. A rotatable nozzle portion is carried by the forward end of the tool body and an elastomeric hose-like element grips the pickup head and the nozzle portion to seal them pneumatically together, to connect them longitudinally, and to rotationally couple them whereby rotation of the nozzle portion effects a like rotation of the pickup head. A trigger means is disposed on the body contiguously to the nozzle portion for selectively coupling the air chamber to tube member.

DESCRIPTIVE LISTING OF THE FIGURES

FIG. 1 is an elevational view, partly in section, of an example of a pneumatically operated pickup tool embodying features of the present invention;

FIG. 2, 3 and 4 are schematic views illustrating different, typical conditions of a pneumatic circuit embodying the operating principles of the present invention;

FIG. 5 is an exploded, perspective view of an example of a pickup head constructed in accordance with the principles of the invention;

FIG. 6 is a sectional view of the assembled pickup head of FIG. 5 illustrating its operation in a vacuum, holding mode;

FIG. 7 is a similar view illustrating its operation in a venturi flow, lifting mode;

FIG. 8 is a sectional view of an alternative pickup head illustrating its operation in a vacuum, holding mode;

FIG. 9 is a similar view illustrating its operation in a venturi flow, lifting mode;

FIG. 10 is a sectional view of a one-piece molded pickup head of the invention;

FIG. 11 is a similar view of a pickup head slightly modified with respect to that shown in FIG. 10;

FIG. 12 is a perspective view of a pickup head of the invention;

FIG. 13 and 14 are sectional views thereof illustrating its operation in vacuum and venturi modes, respectively;

FIG. 15 is a perspective view of an alternative example of a pickup head of the invention;

FIG. 16 and 17 are sectional views thereof illustrating its operation in vacuum and venturi modes, respectively;

FIG. 18 is a perspective view a further example of a pickup head of the invention;

FIG. 19 and 20 are sectional views thereof illustrating its operation in vacuum and venturi modes, respectively;

FIG. 21 is a perspective view of a still further example of a pickup head of the invention;

FIG. 22 and 23 are sectional views thereof illustrating its operation in vacuum and venturi modes, respectively;

FIGS. 24 is a perspective view of yet another example of a pickup head of the invention;

Figure 34:
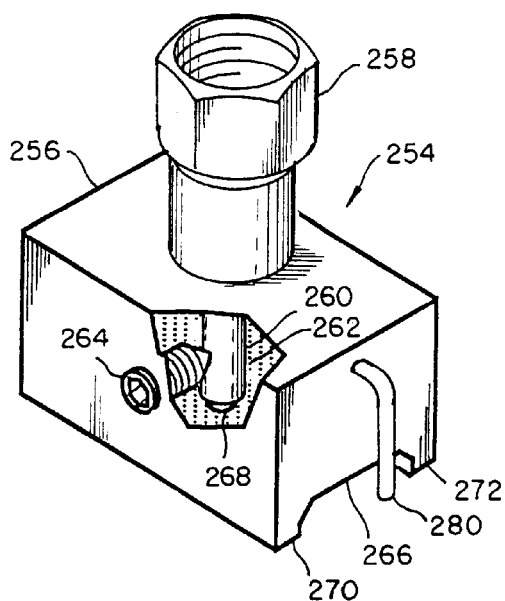
Figure 35:
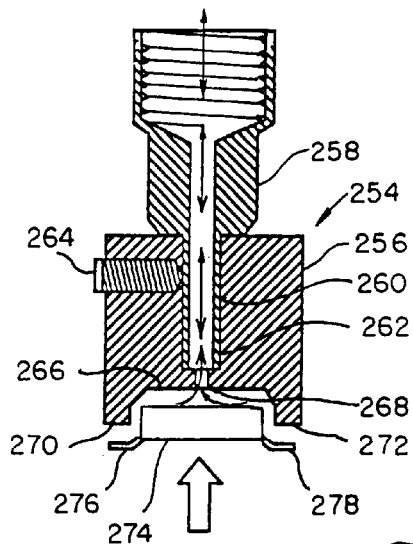
Figure 37:
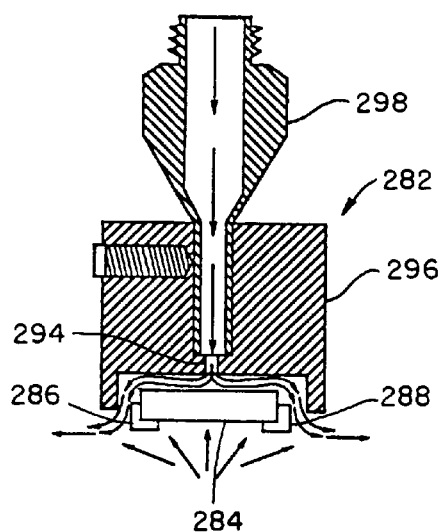
Figure 36:
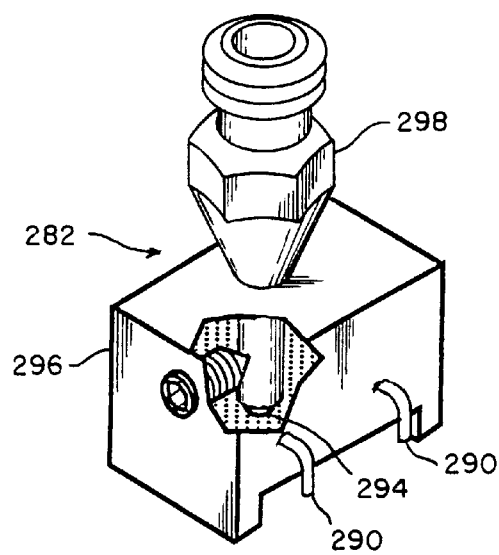
Figure 38:
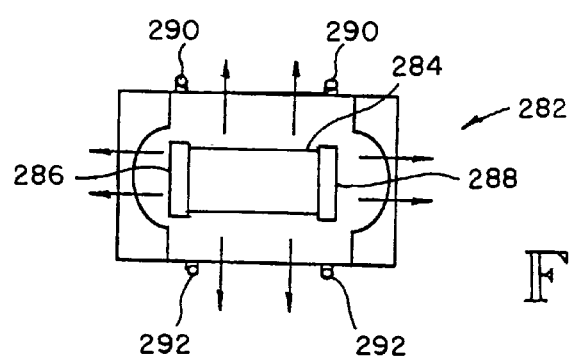
Figure 48:
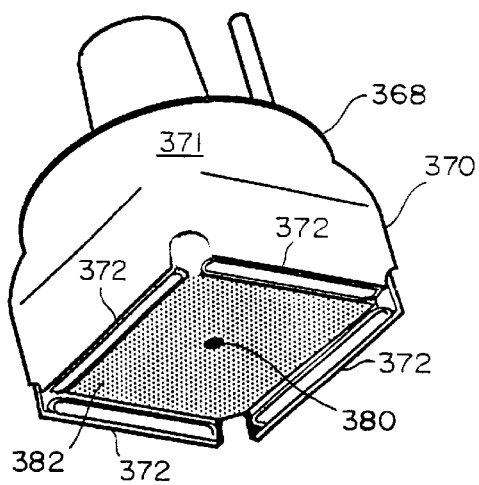
Figure 49:
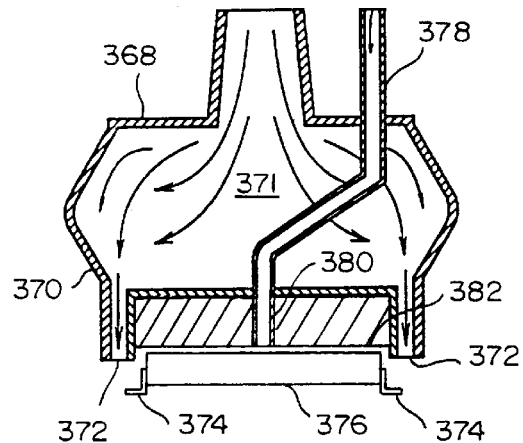
Figure 50:
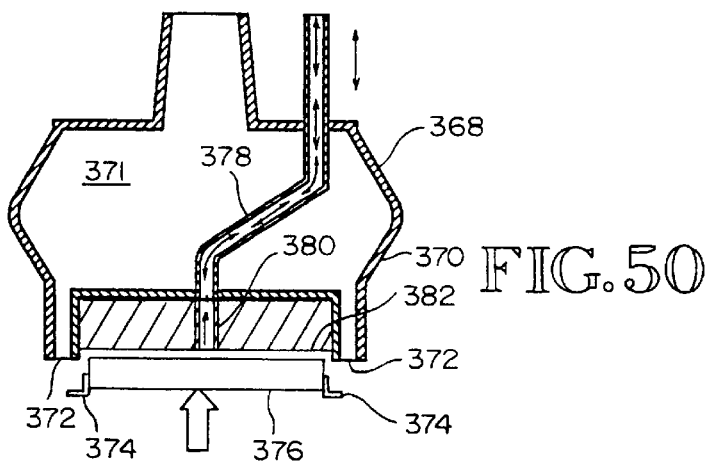

FIG. 25, 26, and 27 are sectional views thereof illustrating its operation;

FIG. 28 is an elevational view, partly in section, of a thin, wand-like example of a pickup tool of the invention;

FIG. 29 is a plan view thereof;

FIG. 30A and 30B are perspective views thereof illustrating a method of its use;

FIG. 31 is a sectional view of an example of a pickup head of the invention particularly adaptable for use with very small parts;

FIG. 32 is an sectional view of a further example of a pickup head of the invention illustrating its use in a venturi flow, lift mode;

FIG. 33 is a like view illustrating its operation in a vacuum holding mode;

FIG. 34 is a perspective view partially broken away, of an example of a combination soldering-pickup head of the invention;

FIG. 35 is a sectional view thereof illustrating its operation in a heating-vacuum lifting mode;

FIG. 36 is a perspective view of a similar combination soldering-pickup head of the invention;

FIG. 37 and 38 are sectional and bottom views, respectively, thereof illustrating its operation in a heating-venturi lifting mode;

FIG. 39 is a sectional view of an alternative example of a pickup head of the invention;

FIG. 40 is a similar view of yet another example of a pickup head of the invention;

FIG. 41 is an elevational view of the front end of an example of the invention incorporating the pickup head shown in FIGS. 5, 6, and 7;

FIG. 42 is a sectional view of an alternative example of a pickup tool front end;

FIG. 43 is a sectional view of a further example of a pickup tool of the invention;

FIG. 44 is a schematic, overall view of the apparatus of example of a pickup tool of the invention in a robotic application;

FIG. 45 is a perspective view of a typical component particularly adapted for robotic handling;

FIG. 46 and 47 are schematic views illustrating the operation of the system of FIG. 44;

FIG. 48 is a perspective view of an example of a combination hot air soldering-desoldering pneumatic pickup head; and FIG. 49 and 50 are sectional views of the pickup head of FIG. 48 illustrating its soldering and pickup operation, respectively.

DETAILED DESCRIPTION OF PREFERRED EMBODIMENT

In FIG. 1, the example of the invention illustrated includes a pickup tool 50 having a hand held body 52 with a central portion 54 forming an air chamber 56. An external, flexible air hose 58 extends from the rear of the body 52 and connects a source of vacuum or pressurized air to the chamber 56. The forward portion of the tool 50 forms a nozzle assembly 60 which is selectively coupled to the air chamber 56 by operation of a spring loaded valve 62 operated with the finger of the operator by pressing an external trigger 64. The valve 62 as shown is of the character to be normally closed; however, in some applications it is desirable that the character of the valve 62 be such as to be normally open as when the pickup tool is to be used in a relatively constant holding mode whereby upon actuation of the valve, the small part being held is then released.

The nozzle assembly, in this example, carries a forwardly extending needle or tube 66 upon the forward tip end of which is mounted a holding head 68 which, as shown in detail below, may be a molded suction cup or a venturi flow plate. Included within the nozzle assembly 60 may be a removable filter element 70 so that when the tool 50 is being operated in a vacuum or suction holding mode, air flow from the holding head 68 is filtered before it enters the air chamber 56 and is drawn through the hose 58 into the vacuum source.

In FIGS. 2, 3, and 4, a source 72 of selectively either vacuum or pressurized air is illustrated which includes, as its energizing input, a coupler 74 for connection to a line of in this example, shop air. Alternatively, a compact and portable compressor, not shown, may provide an energizing source of pressurized, or compressed, air.

The source 72 further includes a venturi, vacuum generator 76 having an input port 78, an exhaust port 80, and a reduced pressure or "vacuum" port 82. The input port 78 is connected to the shop air coupler 74 through an on-off air switch 84 while the exhaust port 80 is selectively connected to a muffler 86 through an on-off vac-air selection air switch 88. The "vacuum" port 82 is directly connected to the hose 58 which feeds the tool 50 of FIG. 1. It is to be noted that the "vacuum" port 82 is so labeled in a conventional sense but may selectively supply either vacuum or pressurized air depending upon whether the vac-air switch 88 is placed in its "on" or "off" mode.

In operation of the source 72, when both the air switches 84 and 88 are open, as shown in FIG. 3, the venturi vacuum generator 76 functions to receive pressurized air at its input port 78 causing an increased velocity flow through the venturi throat 79 to create a lowered pressure, or vacuum, therein which is coupled through the output port 82 and the hose 58 to the air chamber 56 of the tool 50. Thus a vacuum is available to the holding head 68 when the operator chooses to depress the trigger 64 and connect the evacuated chamber 56 to the suction cup head 68.

Alternatively, as shown in FIG. 4, when the air switch 84 is open and the vac-air switch 88 is closed, i.e. in the "air" position, the exhaust port 80 is effectively closed; and the venturi throat 79 functions only to connect the input 78 directly to the "vacuum" port 82 resulting in a positive, or pressurized, condition of the air chamber 56 of the tool 50. Accordingly, upon actuation of the value 62 by the trigger 64, a positive air flow to the holding head 68 occurs. This, as described below, may then create a venturi lifting effect at the head 68.

Thus, once the air switch 84 is opened, or turned "on" as shown in FIGS. 3 and 4, the tool may be supplied instantly with a choice of either vacuum as shown in FIG. 3, or pressurized air as shown in FIG. 4, depending only upon which mode the operator selects for the vac-air switch 88.

Referring to FIGS. 5, 6, and 7, an example of the holding head 68 of FIG. 1 is illustrated as a head 90 and is seen to include a body 92 and a thin flexible annular disc 94. The disc 94 may be cut from, for example, a sheet of silicone rubber for advantages of its flexibility and elastomeric properties as well as its longevity and thermal stability. The holding head body 92 may be molded of a high density plastic or machined from any appropriate rigid material including, for example, Teflon, brass or aluminum. The upper portion of the body 92 terminates in a coupling port 96 for attachment to the tube 66 for coupling the head 90 to the air chamber 56 of the tool 50 (FIG. 1). The coupling attachment, as shown in other figures, may be a short section of elastomeric hose which slides over both the forward end of the tube 66 and the coupling port 96 of the holding head body 92, the cushioning and flexibility as well as the versatility achieved by this type of attachment being particularly desirable in some applications.

The body 92 is formed in this example with a flat, circular holding plate surface 98 and a central duct 100 communicating with the coupling port 96. About the periphery of the plate surface 98, an array of retaining prongs 102 are provided which project downwardly slightly below the plane of the surface 98. Above the plate surface 98, an annular disc retaining groove 104 is formed about the body 92, the inner diameter of which conforms approximately to that of the disc 94 whereby when the disc is assembled to the body 92 as shown in FIGS. 6 and 7, the disc forms a collar lying symmetrically over the lower portion of the body 92 conforming thereto and extending radially outwardly from the circular holding plate surface 98 to form a suction skirt 105.

In operation, referring to FIG. 6, when vacuum is applied from the air chamber 56 of the tool 50 through the tube or needle 66 (FIG. 1) and the port 96 to the holding surface 98, a suction cup is formed by the skirt 105 and the holding surface 98. Thus when the suction skirt is impressed over the upper surface of a component 106, a seal is achieved and the component may be lifted, moved, positioned, and held until released when desired by depressing the trigger 64 which then exposes the suction cup to ambient pressure to release the component.

In FIG. 7, the same structure is illustrated operating in a venturi flow lifting mode. In this example, positive air pressure is applied to the air chamber 56 in the method illustrated in FIG. 4; and when the trigger 64 is depressed, a flow of air is provided downwardly through the holding head duct 100. The holding plate surface may then be placed over the upper surface of a component 108 which has been positioned laterally within the retaining prongs 102. The high velocity of air flow outwardly between the surface 98 and the component 108 causes a reduced pressure such that ambient atmospheric pressure lifts the component and holds it closely and parallel to the surface 98, the holding or lifting effect being totally stable so long as the retaining prongs prevent the component 108 from "floating" laterally away from its contiguous, juxtaposed disposition with respect to the holding surface 98. Note that in this mode, the elostomeric disc 94 has no particular function. When it is desired to release the component 108, the trigger 64 is released and the positive flow of air to the holding space is cut off causing the venturi lifting effect to close. An advantage of this mode of lifting and holding is that the positive air flow which creates the venturi lifting inherently provides cooling for the component 108 which may be desirable if it is being soldered or desoldered in connection with the holding or lifting operation. Another advantage of the venturi lifting mode is that the lifting effect is independent of the shape or texture of the surface of the component, while if suction is to be used, its effectiveness may depend somewhat on the nature of the contacting surface of the component.

To be particularly noted, however, with respect to the holding or pickup tool 50, the same structure may be selectively operated to lift either by suction or venturi effect depending only upon a flip of the air switch 88 by the operator.

In FIGS. 8 and 9 a holding head 110 is illustrated which functions essentially like the holding head 90 of FIGS. 5, 6 and 7. Again the head consists of a rigid body 112 having a central duct 114 communicating between a coupling port 116 and a flat, circular holding plate surface 118 which is provided with an isotropically, symmetrically arranged set of retaining prongs 120 which project downwardly from the plane of the surface 118.

The lower part of the body 112 has a cylindrical portion 121 formed with a pair of o-ring retaining annular grooves 122, 124, the lower of which, groove 124, retains a silicone rubber o-ring 126 such that its lower surface projects downwardly, axially, slightly beyond the retaining prongs 120 to form in cooperation with the holding plate surface 118 a suction cup when placed over a component 128, as shown in FIG. 8, and evacuated by air flow up through the central duct 114 and into the air chamber 56 of the pickup tool 50 (FIG. 1).

When the same holding head 110 is to be used in a venturi lift mode as illustrated in FIG. 9, the o-ring 126 may be removed or, more conveniently, rolled up into the upper retaining groove 122 when desired as, for example, for better visibility of operation. Again, for venturi lift operation, the holding head 110 is energized with a positive flow of air and placed over a component 130 disposed laterally within the retaining prongs 120. The high velocity venturi flow between the upper surface of the component 128 and the holding plate surface 118 creates a reduced pressure such that ambient atmospheric pressure provides a stable lift for the component toward the holding head while the retaining prongs prevent any lateral floating away of the component.

Again the same apparatus may function selectively in the mode of either suction or venturi lift by a simple and immediate operation of the air switch 88 (FIG. 1) by the operator.

Referring to FIG. 10, an example of a one piece holding head 130 formed of a flexible or elastomeric material is illustrated. The head 130 is molded with a hollow cylindrical body portion 132 which forms the central duct 134 for a suction cup formed by a skirt portion 136 and a flat, circular holding plate surface 138 having a set of downwardly projecting retaining prongs 140 thereon. The hollow body portion may be connected as shown, directly over the forward end of the tube 66 of the tool 50.

In operation the head 130 may be provided with a vacuum through its central duct 134 whereby the suction cup functions as such in an essentially conventional manner. When, however, it is desired to operate the holding head in a venturi lifting mode, a positive, outward flow of air is provided in the central duct 134 and the component is placed contiguously to the holding plate surface 138 laterally within the set of retaining prongs 140. Again, the same structure is selectively utilized for either vacuum or venturi lifting simply by selecting between vacuum or positive pressure within the air chamber 56 of the tool 50 when the operator selects the desired on or off mode of the air switch 88.

In FIG. 11, a modified version of the holding head 130' is illustrated. It has been determined empirically that for some applications, additional flexibility of the skirt portion 136' is desirable. This may be readily achieved by providing an annular relief groove 142 symmetrically about the upper surface of the skirt. It will be apparent that the outer portions of the skirt portion 136' may thus bend more easily with the weakening of the region of the disc under the relief groove 142. In all other essential respects, the structure and function of the holding head 130' may be considered to be identical to that of the holding head 130 of FIG. 10.

Referring to FIGS. 12, 13, and 14, an example of a holding head 144 is illustrated in which an o-ring 146 in a retaining groove 148 in the cylindrical body portion 150 of the head functions not only to form, as in FIG. 13, a suction cup in cooperation with its bottom, holding plate surface 152 but also constitutes a retaining fence for a component 154 when venturi lift effect is to be used as indicated in FIG. 14.

It may be noted that although "suction cup" terminology may be used herein, a "cup" per se is not normally required for vacuum holding: when a flat plate is placed over the top surface of a flat component and the space between them evacuated, the conditions are usually such as to provide adequate holding forces due, of course, to ambient atmospheric pressure being impressed on the non-evacuated surfaces of the component. A cup, however, when provided with a flexible outer lip may maintain a better seal and thereby result in a greater and more reliable holding force.

In the holding head 156 of FIGS. 15, 16 and 17, its body portion 158 is shown as somewhat square and having a circular flat holding plate surface 160 defined by a circular groove 161 concentric about its central duct 162. Each of the somewhat square corners of the body extending laterally outside the circular groove 161 form, in cooperation with that part of the groove between it and the circular holding plate surface, a holding means for a rubber o-ring about each corner as shown. The four such o-rings 164, 166, 168, 170 together form a cushioned retaining fence for positioning and holding components whether the pickup tool is being operated in its vacuum or venturi lift mode as indicated, respectively, in FIGS. 16 and 17.

In FIGS. 18, 19 and 20, an example of a holding head 172 is illustrated having an essentially square body portion 174 with a bottom, flat holding plate surface 176. Each of the corners 178, 180, 182, 184, projects slightly below the surface 176 to form a set of retaining prongs 178', 180', 182', 184' for positioning and holding a component 154, again, whether the operator has chosen to utilize the tool 50 in a vacuum holding or venturi lift mode as illustrated, respectively, in FIGS. 19 and 20.

Referring to FIGS. 21, 22, and 23 the example of a holding head 186 shown includes a circular body portion 188 having a flat holding plate surface 190 formed concentrically about its central air duct 192 which feeds through a coupling port 194 for a connection as to the tube 66 of the tool 50 of FIG. 1. The circular body portion 188 is provided with a set of set screws 196 arranged symmetrically about the circular holding plate surface 190 near its periphery. The threaded screws 196 in this example have pointed ends protruding through and slightly below the surface 190 to form retaining prongs of adjustable length. For operation in a vacuum holding mode, the screws may be relatively or totally withdrawn from their protrusion below the holding surface 190. On the other hand, for venturi lift operation the screw points may be lowered further such that their points may, for lateral stability, either engage a textured surface of the component 154 or provide a retaining fence therefore as in above examples. Further, as described below in connection with robotic applications, the lifting surface of the component may be provided with positioning indents for engagement with the pointed tips of the screws 196.

The example of the holding head 198 shown in FIGS. 24, 25, 26, 27 is similar in principle to that of FIG. 21, the function of the individual set screws 196 being provided by a set of retaining prongs 200 carried by a floating collar 202 and projecting through a matching set of bores 204 in the circular body 206 normal to its flat, circular holding plate surface 208. The collar 202 is centrally bored and is disposed about the reduced diameter coupling port portion 210 of the head 198 in a manner such that it is free to slide up and down in response to gravity or being pushed upwardly by the force of a component 154 being held either by vacuum or venturi lift effects. A further beneficial effect of its freedom to move easily up or down is that when in a venturi flow lifting mode, the retaining prongs are automatically lifted to provide a spacing between the component and the surface 208 which maximizes the venturi lifting force.

Referring particularly to FIG. 27, it is demonstrated that the set of prongs 200 may provide a retaining fence for laterally holding a smaller component 154' particularly when opening in the venturi lift mode.

In FIGS. 28, 29, 30A and 30B a thin profile example of the invention particularly adapted for picking up or handling thin wafers or discs is illustrated. The nozzle assembly 60' of the pickup tool 50 is provided with a male, threaded fitting to which is threadingly affixed, by a coupling nut 212, a tube 66'. A thin, wafer-like holding head 214 is, carried by the front end of the tube 66'. The thin, circular head 214 is provided with a bore 216 parallel to its flat holding plate surface 218. The tube 66' is firmly fitted into the bore 216 and communicates with the central duct 220 of the surface 218. An o-ring retaining groove 221 is provided in the cylindrical, outer surface of the head 214 such that when an o-ring 222 is placed therein it projects slightly below the plane of the surface 218 and forms a holding suction cup with the surface 218 when operating in a vacuum mode or a retaining fence for small parts when operating in a venturi lift mode.

In operation, the wand-like holding head 214 may be used, typically in a vacuum holding mode, to select a particular wafer or disc 224 from a compact stack thereof and/or place it with precision in a desired stack or other tight position. The operator may then release the trigger at his fingertip on the tool 50 and leave the part in its desired disposition.

Referring to FIG. 31, an example of a versatile multiple use pickup head 226 for the tool 50 is illustrated. The head 226 is adapted for handling particularly small elements or parts and is typically utilized in the vacuum holding mode of the invention. A short length of rubber tube 228 with an inner diameter slightly less than the outer diameter of the pickup tool's tube or needle 66 is disposed over the forward end thereof with a pickup lip 229 of the rubber tube 228 extending forwardly of the end 230 of the tube 66. The lip 229 may preferably be formed by a truncated conical bevel edge converging radially and axially inwardly leaving a circular peripheral edge having its diameter equal to the outer diameter of the rubber tube 228. In a suction lift mode, then, a small, or very small, part may be positioned against the suction cup formed by the lip 229 and the tube 66 while a vacuum is applied to its interior by connection to the evacuated air chamber 56 by depressing the trigger 64 of the tool 50 (FIG. 1).

When a slightly larger "suction cup" is desired, a second short length of rubber tube 232 having an inner diameter approximately equal to the outer diameter of the rubber tube 228 may be affixed thereover with its forward pickup lip 234 extending just forwardly of the lip 229 of the smaller, inner tube. Again, the lip 234 may be formed to have a conically beveled end with the truncated conical surface converging radially and axially inwardly away from its outer, circular peripheral edge. The suction cup operation of the pickup lip 234 may then be the same as with the smaller lip 229 of the tube 228. In its operation, however, it will be seen that the outer tube 232 may be selectively slid axially back or forth with respect to the position of the inner tube 228 to provide exposure of whichever diameter "suction cup" is desired for the particular instant operation. It may further be seen that additional rubber tube segments may be added over the tube 232 to provide even larger "suction cups" for the pickup tool.

In FIGS. 32 and 33, another example of a pickup head incorporating a short length of rubber tube is illustrated. A pickup head 236 is provided having a central, cylindrical body portion 238, a coupling port 240 extending upwardly therefrom and connected to the forward end 230 of the tube 66" of the pickup tool 50, a central duct 242 communicating between the port 240 and a flat circular holding plate surface 244, and an enlarged diameter truncated conical body portion 24 extending between the central body portion 238 and the holding plate surface 244. A short length of rubber tube may be utilized as shown to form a coupling sleeve 248 for connecting the port 240 to the end of the tube 66".

A larger diameter section of thick-walled rubber tube 250 is disposed over the body portion 238 and forms a circular retaining lip 252 concentric with the holding plate surface 244 and its central duct 242 and extending slightly below the plane of the surface 244. The lower end of the tube 250 may be provided with a truncated conical bevel end converging axially and radially inwardly and at approximately the same conical angle as that of the conical body portion 246.

In operation, the pickup head 236 may be placed over a component 154 utilizing the lip 252 to retain it laterally therewithin while, as shown in FIG. 32, a positive, venturi lifting effect air flow is delivered through the central duct 242 and between the holding surface 244 and the top of the component 154.

Alternatively, as indicated in FIG. 33, the same holding head 236 may operate in a vacuum or suction lift mode whereby the lip 252 forms a suction cup for holding the component while vacuum is applied through the central duct 242. It may also be noted that the rubber tube 250 may be adjustably slid up or down on the body portion 238 to achieve a desired optimum of lifting and lateral retaining effects.

Referring to FIGS. 34 and 35, a combination soldering-desoldering pickup tool head 254 is illustrated which includes a heated body affixed to the electrically heated tip of a conventional soldering tool, not shown. Such a soldering tool, for example, may be that shown in Applicant's U.S. Pat. No. 4,926,028 entitled "HOT AIR HEATED SOLDERING INSTRUMENT," May 15, 1990, or No. 5,483,040 entitled "ELECTRICALLY HEATED HOT GAS SOLDERING INSTRUMENT," Jan. 9, 1996, or No. 4,419,566 entitled "HOT AIR SOLDERING AND DESOLDERING SYSTEM," Dec. 6, 1983. The soldering-lifting head 254 includes a metallic heat accumulating body 256 which is connected mechanically and thermally to the heated tip of a soldering iron by a metallic coupler body 258 having a threaded cap, upper end 259 which may be threaded onto the soldering iron tip. The opposite or forward end of the coupler body is a reduced diameter tube 260 which is snugly engaged in a central bore 262 of the heat accumulating body 256. A set screw 264 disposed transversely through the body 256 secures the assembly. The bottom of the body 256 has a flat holding plate surface 266 perpendicular to the axis of a central duct 268 which communicates through the tube 260 to the soldering iron, not shown. Along each of two opposite sides of the surface 266, the body 256 is formed to provide an elongated soldering edge 270, 272 which extends below the plane of the surface 266 for a distance somewhat greater than the height of a component 274 of the character having a row of soldering tabs 276, 278 disposed, respectively, along each of its parallel sides. A guide prong 280 is provided at each end of the body 256 to aid in positioning the head 254 over the component 274, and to retain it from floating or sliding out of its position between the soldering edges 270, 272.

In operation, for example, in placing, positioning, holding, and soldering the component 274 to a circuit board, not shown, the component may be held by vacuum lifting while it is accurately positioned where desired on the circuit board. The holding vacuum may then be released while the solder on the soldering tabs 276, 278 is reflowed; or the part may continue to be held, as desired. Also, once positioned, the part may be cooled by a positive flow of relatively cool air through the duct 268. The part may also be both cooled and held at the same time by venturi lift effect with the same apparatus.

In FIGS. 37, 38 and 39, an example of the invention similar to that of the next preceding figures is shown except that the illustrated soldering-pickup tool head 282 is of the character to handle a component 284 having a row of soldering tabs 286, 288 disposed across each of its ends, respectively: and a pair of guide prongs 290, 292 are provided along each side respectively of the head 282. Further, in this example, the solder reflow is achieved by application of hot air through the central duct 294 of the body 296 connected by a threaded coupler body 298 to the tip of a hot air type soldering tool as shown in the above patent references.

In the operation of this example, hot air is supplied by positive flow through the duct 294 to provide a venturi lift effect for holding and positioning the component 284. The hot air is then further applied until the solder at the tabs 286, 288 is reflowed. The air flow may then be cut off and the head 282 removed. Alternatively, in a desoldering and component removal operation, the head 282 may be placed over the component 284 as shown and hot air applied through the duct 294 until the solder on the tabs 286, 288 is reflowed and the component is free to be lifted away. The continuing flow of air will then lift the free component away from its circuit board, carried to a different location and dropped by cutting off the flow of venturi lifting air.

Referring to FIG. 39 an example is illustrated which is particularly adapted for handling larger, heavier parts or components. The pickup tool 50 with the threaded tip nozzle assembly 60' may be the same as that shown in FIGS. 28 and 29. A pickup head 300 is shown having a threaded bore 302 affixed onto the nozzle assembly 60' with a sealing, stabilizing o-ring 304 disposed compressively there between in the bottom of the bore 302. The flat working holding plate surface 306 of the head 300 is in the example disposed at an angle of approximately 45° to the axis of the tool 50 and communicates with the interior thereof through a central duct 308 as in the example of FIGS. 8 and 9. A large rubber o-ring 310 may be disposed in a peripheral retaining groove 312 such that the lower surface of the o-ring projects slightly below the plane of the surface 306 to form a suction cup for a vacuum holding mode of operation or as a retaining fence for a component being handled in a vertical lift mode. Again, an upper retaining groove 314 is provided into which the o-ring may be rolled when desired.

The example of a pickup head 316 shown in FIG. 40 may be seen to be essentially like that of the head 300 except that its retaining bore 318 is not threaded and it fits over a smooth tip 319 of a nozzle assembly 60" and is secured thereto at a predetermined desired angle by a set screw 320 carried by the body 322 of the head 316 and compressed into an angular retaining groove 324 on the tip 319 of the nozzle assembly. An o-ring 326 may be disposed in a second annular retaining groove 328 on the tip 319 for providing a seal for the air flow within the tool.

In operation, the larger holding plate surfaces of the heads 300 and 316 obviously provide a greater holding force for a given magnitude of vacuum or pressure supplied by the tool and their disposition closer to the hand of the operator minimize the effective lever arm length of the tool when handling heavier components.

In FIG. 41 an example of the invention shown includes a pickup head 330 like that of FIG. 6 affixed to the forward end of the tube 66 which in this case is attached to the threaded tip of the nozzle assembly 60' by a threaded retaining nut 332 which may be tightened to secure the tube 66 at a desired angle with respect to the position of the operator's finger on the trigger 64 of the tool 50.

In FIG. 42 a reduced diameter shank portion 333 of a pickup head 334 is shown disposed over the forward end of the table 66 and is free to rotate thereabout. A rotatable wheel 336 is disposed over the forward tip end of the nozzle assembly 60 and is also formed with a reduced diameter shank portion 338. A length of thin walled, flexible rubber hose 340, whose inner diameter is greater than that of the tube 66 but less than that of the shank portions 333 and 338, is disposed over each thereof and extends over the length of the tube 66 therebetween. Thus the pickup head 334 is held in place over the front end of the tube 66 by the rubber tube 340 and may be rotated by turning the wheel 336 as desired for positioning a small part while it is being held by operation of the pickup head.

Referring to FIG. 43 an example of the invention is illustrated in which a pickup head 342 is carried by the forward end of a tube 344 which may be rigidly affixed to the nozzle assembly 60 which in this example is free to rotate about the axis of the tool 50 while being restrained by a set screw 346 carried by the nozzle assembly and inserted into an similar retaining groove 348 provided in the forward portion 350 of the body 54 of the tool 50. A positioning wheel 352 may then be affixed to the nozzle assembly 60 contiguously to the trigger 64 by a set screw 354 whereby the finger of the operator may readily operate the trigger as well as position or orient the component 154 by rotating the wheel 352, the operation of the tool 50 and the pickup head being otherwise as described above in connection with the earlier figure.

In FIGS. 44, 45, 46, and 47 a robotic combination 355 of the pickup tool 50 is illustrated schematically. In this example the pickup tool 50 is carried by a robotic system and oriented, positioned, and operated automatically by an NC program or a microprocessor or the like the detailed structure and operation of which is conventional and not within the scope of the present invention. The actual operation of the pickup tool 50 here may be considered to be the same as described above except that an example of position feedback signals to the robot operation may be provided as in the following example. Assuming a venturi lift mode of holding is being utilized, and that a set of retaining prongs 356 project downwardly from the flat holding plate surface 358 of a pickup head 359 and have been designed to register with a matching set of indent markers 360 disposed in the top, holding surface of a component 362 which is to be selected, picked up, and positioned by the robot system. When the pickup head 359 moves to select and pick up the component 362 in a predetermined, proper orientation, a flow meter 364 monitors the magnitude of this flow through the low pressure, holding space between the surface 358 and the component 362. When the retaining prongs 356 are precisely in register with the indent markers 360, as indicated in FIG. 46, a predetermined correct, and minimum rate of flow is detected by the meter 364; and the robot's computer, through its sensor 366 proceeds with the next step in its carrying, positioning, and orienting of the component 362. When, however, as shown in the case illustrated in FIG. 47, the prongs 356 are not fully in register with the indent markers 360, the magnitude of venturi lift air flow through the space between the component 362 and the holding surface 358 is sensed by the flow meter 364 to be incorrect, excessive; and the robot through its sensor 366 knows it is not ready to proceed to the next step. Instead the system would be programmed to release the component 362 and try again to pick it up properly.

It may be noted that this same feed mechanism may be utilized when the tool 50 is being operated in a vacuum holding mode: the flow rate in the example of FIG. 46 will be a predetermined, minimum magnitude and in the case illustrated in FIG. 47, the rate will be detectably greater.

Referring to FIGS. 48, 49, and 50 an example of a combination hot air solder-desolder-pickup head 368 is illustrated. The head includes a body 370 which may be connected to a source, not shown, of soldering hot air such as that shown in the above reference patents. The interior of the body 370 forms a hot air plenum 371 which feeds an array of soldering hot air outlets 372 which are configured to be placed over a like array of soldering tabs 374 disposed along the lower edges of a component 376. In addition to the hot air supplied to the plenum 371, a lifting-cooling supply of air, either by suction or positive pressure, is provided through a duct 378 which may be connected to an air supply system such as that shown above in FIG. 2. The duct 378 communicates with a central duct 380 in the holding plate surface 382 of the pickup head 368.

In operation, the component 376 may be held or emplaced by venturi lift effect as indicated in FIG. 49, then the soldering hot air may be impressed through the soldering air outlets 372 to reflow the solder at the tabs 374. In the meantime, the air flow in a desired flow rate may be continued to be supplied through the duct 378 to cool the component 376 while the solder is being melted.

In a desoldering operation as illustrated in FIG. 50, the head 368 may be placed over the component 376 and hot air supplied to the tabs 374. At the same time, a vacuum may be applied through the central duct 380 to the space between the component and the holding surface 382 so that when the solder is reflowed, the component will be automatically lifted at the earliest possible moment.

I claim:

1. A rotatable hand held pickup tool for small parts comprising:

a body having a central longitudinal axis along its forward portion and containing an air chamber and having an input air port connected to its rearward portion;

a forward nozzle portion carried by the forward portion of said body and having a freedom of rotation about said axis and including a finger operable wheel portion to effect such rotatation and a forwardly extending coupler shank portion having a first, outer diameter and a second, inner diameter;

a rigid tubular member carried by siad forward portion of said body and extending forwardly therefrom beyond said nozzle portion and having a third, outer diameter less than said second diameter:

a pneumatic pickup head having a reduced diameter coupler shank portion extending rearwardly therefrom and having an inner diameter slightly greater than said third diameter, said coupler shank being disposed concentrically over and supported by the forward end of said tubular member with freedom of rotation thereabout;

a length of deformable elastomeric tubing having a non-deformed inner diameter greater than said third diameter and less than each of said first and second diameters and having a length to extend over the outer surfaces of said coupler shank portions of said pickup head and said nozzle portion whereby when disposed thereover, said nozzle portion and pickup head are both longitudinally connected and rotationally coupled together; and a finger operated valve means carried by said body, disposed contiguously to said finger operable wheel portion and selectively coupling, pneumatically, said air chamber and tubular member.

* * * * *